United States Patent
Hall et al.

(10) Patent No.: US 10,312,856 B2
(45) Date of Patent: Jun. 4, 2019

(54) PHOTOVOLTAIC MODULAR CONNECTOR SYSTEM

(71) Applicants: David R. Hall, Provo, UT (US); Seth Myer, Provo, UT (US)

(72) Inventors: David R. Hall, Provo, UT (US); Seth Myer, Provo, UT (US)

(73) Assignee: Hall Labs LLC, Provo, UT (US)

( * ) Notice: Subject to any disclaimer, the term of this patent is extended or adjusted under 35 U.S.C. 154(b) by 58 days.

(21) Appl. No.: 15/274,293

(22) Filed: Sep. 23, 2016

(65) Prior Publication Data
US 2018/0091092 A1    Mar. 29, 2018

(51) Int. Cl.
| | |
|---|---|
| H02S 40/36 | (2014.01) |
| H01L 31/048 | (2014.01) |
| H02S 40/30 | (2014.01) |
| H02S 20/26 | (2014.01) |
| H02S 20/30 | (2014.01) |
| H01L 31/02 | (2006.01) |
| H02J 3/46 | (2006.01) |
| H02J 3/38 | (2006.01) |

(52) U.S. Cl.
CPC ........ *H02S 40/36* (2014.12); *H01L 31/02013* (2013.01); *H02S 20/26* (2014.12); *H02S 20/30* (2014.12); *H02S 40/30* (2014.12); *H01L 31/048* (2013.01); *H02J 3/383* (2013.01); *H02J 3/46* (2013.01); *Y02E 10/50* (2013.01)

(58) Field of Classification Search
CPC .......... H02S 40/30; H02S 40/36; H02S 20/26; H02S 20/30; H01L 31/048; H02J 3/383; H02J 3/46
See application file for complete search history.

(56) References Cited

U.S. PATENT DOCUMENTS

| | | | | |
|---|---|---|---|---|
| 6,406,982 B2 * | 6/2002 | Urakami | ............... | H01L 21/761 257/E21.223 |
| 2007/0256727 A1 * | 11/2007 | Gumm | .................. | H01L 31/048 136/251 |
| 2012/0151856 A1 * | 6/2012 | Azoulay | ................. | H02S 20/25 52/173.3 |
| 2013/0125958 A1 * | 5/2013 | Meakin | ............... | H01L 31/0485 136/251 |
| 2014/0246069 A1 * | 9/2014 | Chaintreuil | ......... | H01L 31/0201 136/244 |

FOREIGN PATENT DOCUMENTS

DE       4140682 A1 *  6/1993 ............. E04F 13/08

* cited by examiner

*Primary Examiner* — Matthew T Martin

(57) ABSTRACT

A photovoltaic modular connector system is disclosed. Electrically conductive contacts embedded into the surface of each of one or more photovoltaic (PV) modules provide the connection point for two PV modules to be connected together.

PV modules are connected together by removing a protective backing material from an adhesive area surrounding a first set of contacts of a first PV module, and adhering to an adhesive area surrounding a second set of contacts of a second PV module, the adhesive making the connection and sealing and protecting the contact area.

No external wiring, connectors or devices are required to make the electrical connection between two PV modules. Contacts are integral and embedded into the surface of each individual PV module. The PV modules have adhesive on the back to allow them to be adhesively attached to a surface without additional mounting hardware.

17 Claims, 16 Drawing Sheets

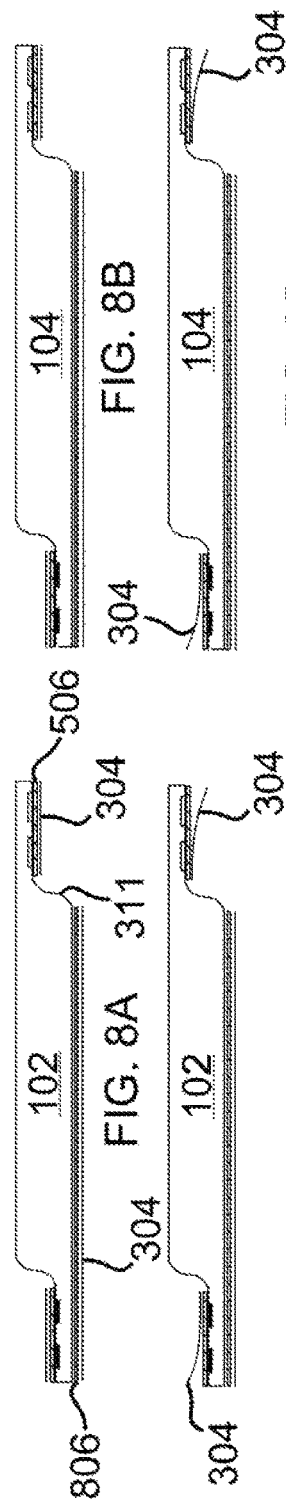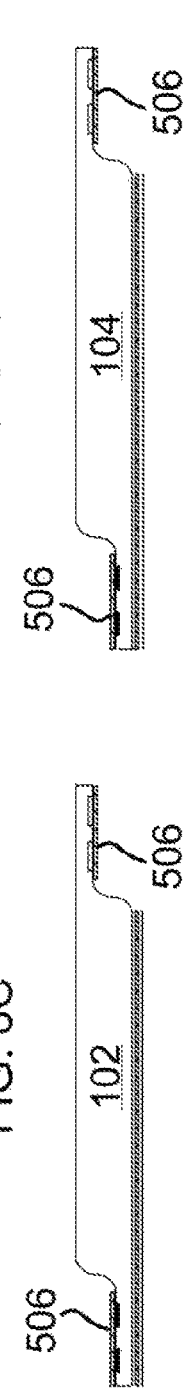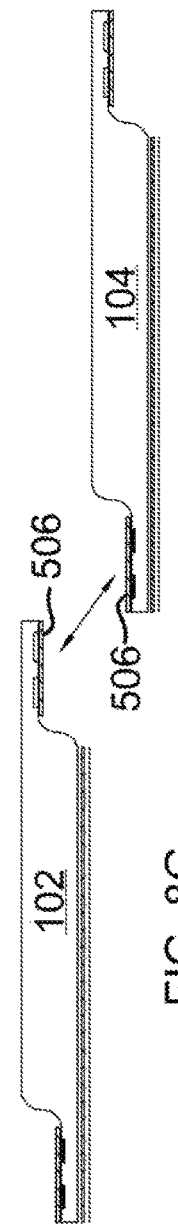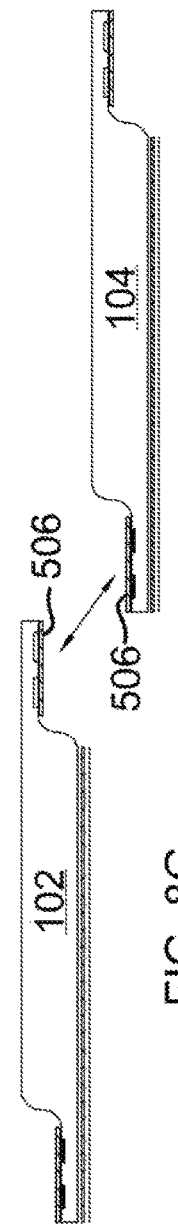

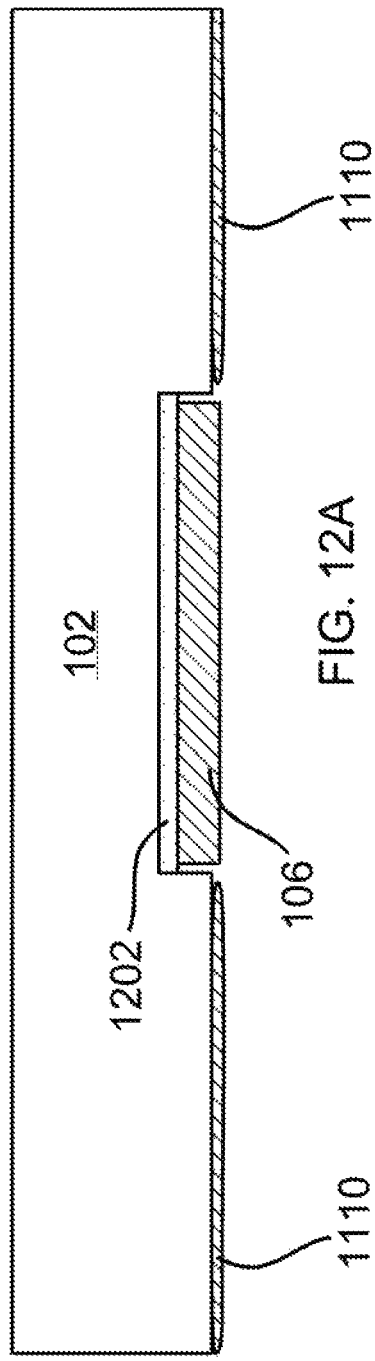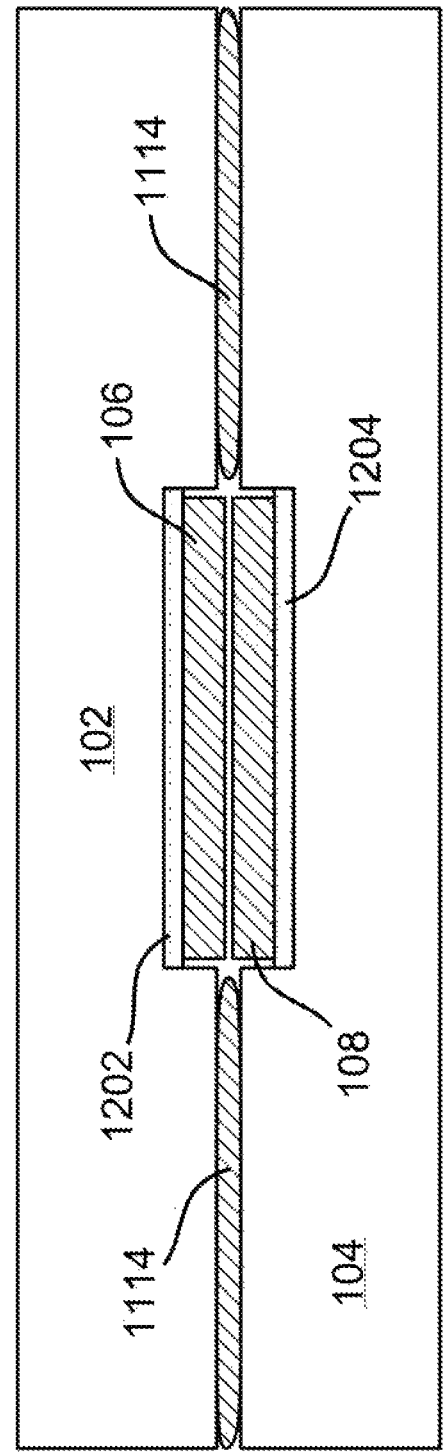

PHOTOVOLTAIC MODULAR CONNECTOR SYSTEM

BACKGROUND

Field of the Invention

This invention relates to connectors for modular photovoltaic systems.

Background of the Invention

Solar power systems typically consist of a series of solar panels or modules connected together either in series or in parallel. They are normally connected by wires with male and female connectors on either side of the wiring that connects the modules. The wiring is either run along the backside of the modules along the mounting rack, or along the inside of the back frame of the module or panel itself. In some cases, the wiring is run inside a wiring chase or raceway behind the modules.

Alternatively, the connecting wiring for multiple solar modules is integrated within the module itself, as described in patent application Ser. No. 15/261,160 submitted 9 Sep. 2016, entitled "Photovoltaic Modular System". When the wiring is integrated or embedded within each of the modules in the system, there still is the need to connect the wiring between two adjacent modules.

For systems with microinverters at each solar panel, the DC voltage is inverted to AC power, and a junction box is required for the connection to the power circuits that extend back to the AC service panel. The connection to the interconnecting wiring with wire nuts or connectors, and installing junction boxes requires a lot of time and labor.

In summary, the key advantages posited for the photovoltaic modular connector system include a system that:

incorporates the connectors into each individual module, and allows the PV modules to be directly connected together without the need for additional interconnecting wiring.

SUMMARY

This invention has been developed in response to the present state of the art and, in particular, in response to the problems and needs in the art that have not yet been fully solved by currently available systems and methods. Features and advantages of different embodiments of the invention will become more fully apparent from the following description and appended claims, or may be learned by practice of the invention as set forth hereinafter.

Consistent with the foregoing, a photovoltaic (PV) modular connector system is disclosed which simplifies the installation of photovoltaic modules allowing the modules to be installed and connected together in the same step.

The PV modular connector system, comprising contacts of an electrically conductive material embedded into a surface of a PV module with a peel and stick adhesive backing to allow a first PV module to be connected to a second PV module. The adhesive backing is removed exposing adhesive, and the first PV module is adhesively attached to the second PV module. Electrical wiring connected to the first PV module circuitry is connected via the contacts of the first PV module connecting to the contacts of the second PV module allowing the electrical current to flow between the first PV module and the second PV module. The electrical wiring connected to the one or more contacts is completely encapsulated and electrically insulated.

In an embodiment of the invention, the one or more contacts of the first PV module have a rectangular or oblong shape running parallel to a long side of the first PV module, and mating the one or more contacts of the second PV module having a rectangular or oblong shape running perpendicular to a long side of the second PV module.

An electrically insulating adhesive area separates each one or more contacts from all other adjacent one or more contacts; wherein the electrically insulating adhesive allows for expansion and contraction, and an entire surface area of the electrically insulating adhesive area is covered by a protective peel and stick paper backing.

The electrically insulating adhesive of the first PV module when adhesively connected to the second PV module creates an air tight and moisture tight seal encapsulating the one or more contacts; wherein the width of the electrically insulating adhesive creating an air tight and moisture tight seal surrounding the one or more contacts is at least 2 cm.

The one or more contacts embedded into a surface are completely encapsulated except for one surface of the one or more contacts. In another embodiment, the one or more contacts embedded into a surface have only one surface of the one or more contacts embedded into the exterior surface of the PV module, and all other surfaces are exposed. The one or more contacts are comprised of one or more of electrically conductive materials including alloys of copper, aluminum, nickel, stainless steel, silver, graphite, tungsten, and carbide. The one or more contacts are rated for a total combined electrical current flow of a plurality of connected PV modules. Two adjacent one or more contacts are separated by a distance of at least 2.0 cm.

In one embodiment of the invention, the one or more contacts are coated with an electrically conductive adhesive, wherein the electrically conductive adhesive comprises one or more electrically conductive materials of carbon, graphite, tungsten, graphene, carbon nanotubes and carbide. The electrically conductive adhesive area covers an entire area of one or more contact and extends at least 0.5 cm beyond each boundary edge of a surface of the one or more contacts.

In another embodiment, the one or more contacts in the first PV module are embedded with a foam backing providing load deflection forcing the one or more contacts outward from the first PV module towards the one or more contacts in the second PV module.

In yet another embodiment, the one or more contacts are coated with an electrically conductive metal with a low melting point from the group of one or more elements including alloys comprising: gallium, rubidium and phosphorus.

In order to allow the alignment of two PV modules prior to attachment, an embodiment of the invention comprises the first PV module with a notch for viewing an alignment line printed on the surface of the second PV module. In another embodiment, the first PV module has an alignment line printed on the surface for visual alignment of the second PV module.

Adhesive areas surrounding the contacts adhesively attaches the contacts and an area surrounding the contacts of the first PV module to the second PV module, wherein each PV module also has an attachment surface area of the PV module covered with adhesive so that the PV module can be adhesively attached to a surface. Each adhesive area is covered with a protective backing material.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 8A is a side view of the first PV module prior to connection.

FIG. 8B is a side view of the second PV module prior to connection.

FIG. 8C is a side view of the first PV module prior to connection, with protective backing material partially removed from the contacts.

FIG. 8D is a side view of the second PV module prior to connection, with protective backing material partially removed from the contacts.

FIG. 8E is a side view of the first PV module with protective backing material completely removed from the contacts showing how it connects to the second PV module.

FIG. 8F is a side view of the second PV module with protective backing material completely removed from the contacts showing how it connects to the first PV module.

FIG. 8G is a side view of the first PV module with protective backing material completely and arrows showing how it connects to the second PV module.

FIG. 8G is a side view of the second PV module with protective backing material completely and arrows showing how it connects to the first PV module.

FIG. 8I is a side view of two PV modules connected together.

FIG. 12A is a side view of the PV module's contact with foam backing.

FIG. 12B is a side view of two PV modules' contacts with foam backing that are connected together.

DETAILED DESCRIPTION OF THE DRAWINGS

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
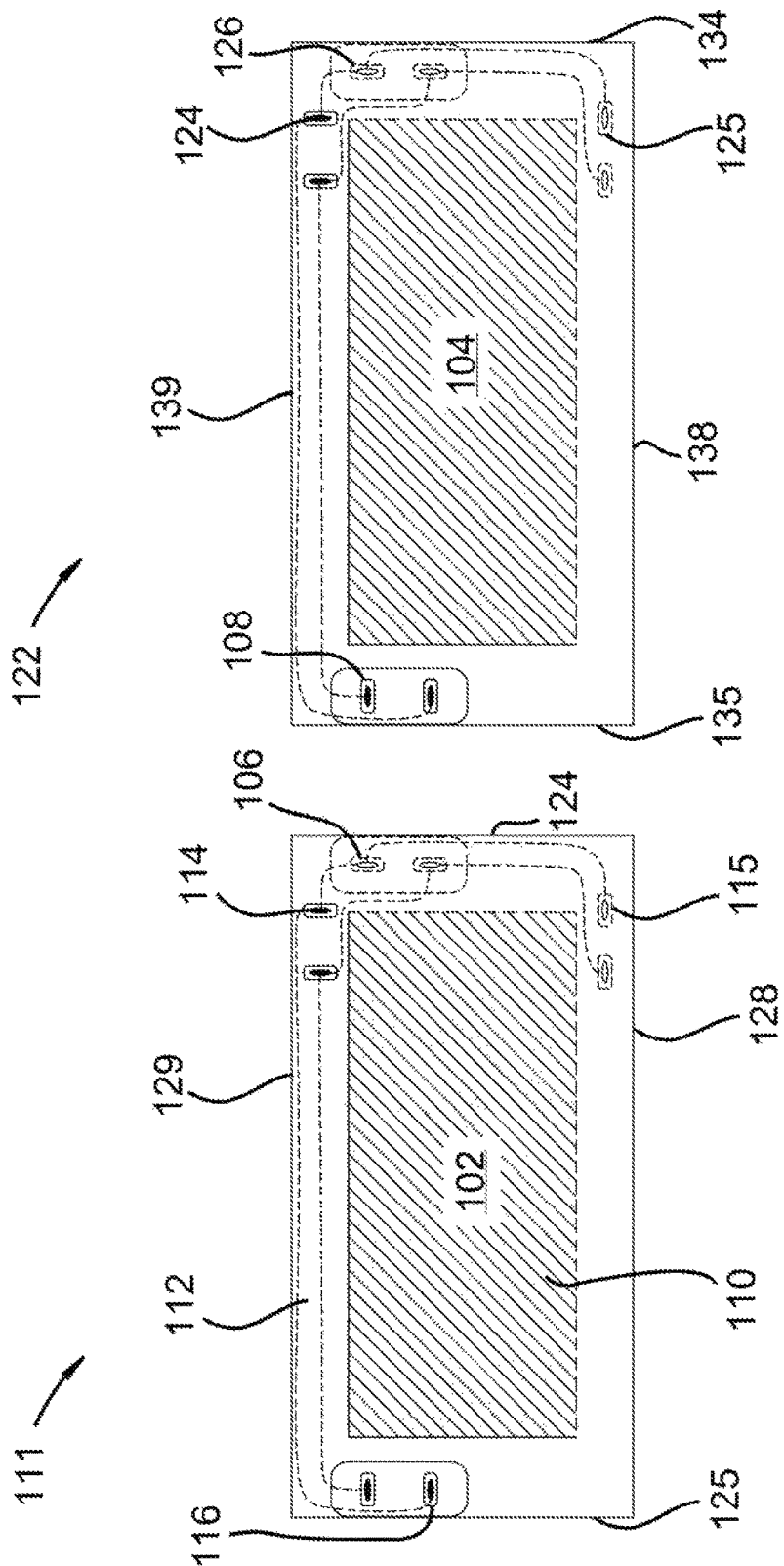
FIG. 1A is a top view of a first PV module.
FIG. 1B is a top view of a second PV module.

FIG. 1A is a top view 111 showing a top surface of a first PV module 102 showing the electrical wiring 112 and contacts 106, 114, 115 and 116. The first PV module 102 is compatible with adjacent PV module 104. In order to electrically connect the wiring from PV module 102 to the wiring of PV module 104, each module has contacts on the top and bottom of each PV module that enables the PV modules to be connected together. The electrical wiring in each PV module is connected to the contacts. The vertical contacts 106 on a bottom surface of the PV module, and next to the right hand side 124 of PV module 102 are designed to connect to the horizontal contacts 108 on the top surface next to the left hand side 135 of PV module 104. The internal wiring 112 is also connected to an array of PV cells 110. Additional PV modules can be connected to side 128 via contacts 115, side 125 via contacts 116, and side 129 via contacts 114.

FIG. 1B is a top view 122 showing a top surface of a second PV module 104 showing contacts 108, 124, 125 and 126. Additional PV modules can be connected to side 138 via contacts 125, side 134 via contacts 126, and side 139 via contacts 124.

Figure 2:
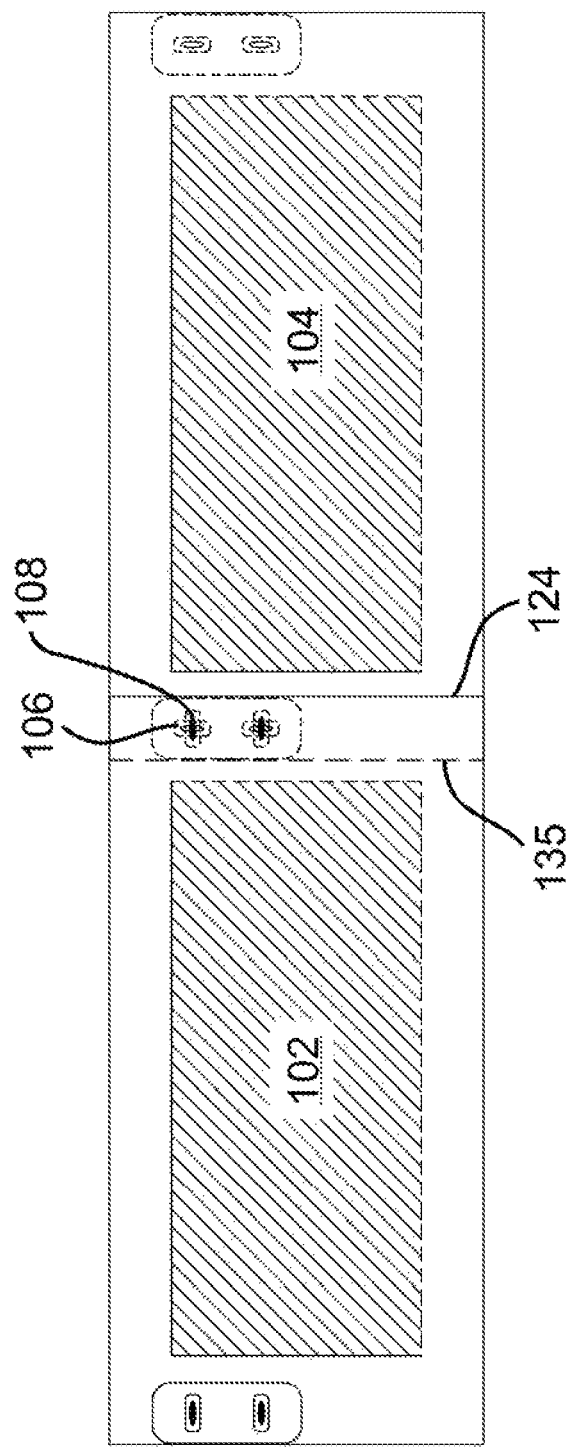
FIG. 2 is a top view the first and second PV modules connected together.

FIG. 2 is a top view of two PV modules illustrating an example of how they are connected together. The right edge 124 of PV module 102 slides over and on top of the adjacent PV module 104, overlapping the left edge 135 of PV module 104. The contacts 106 of PV module 102 align with the contacts 108 of PV module 104 and electrically connect the PV module 102 to PV module 104.

Figure 3:
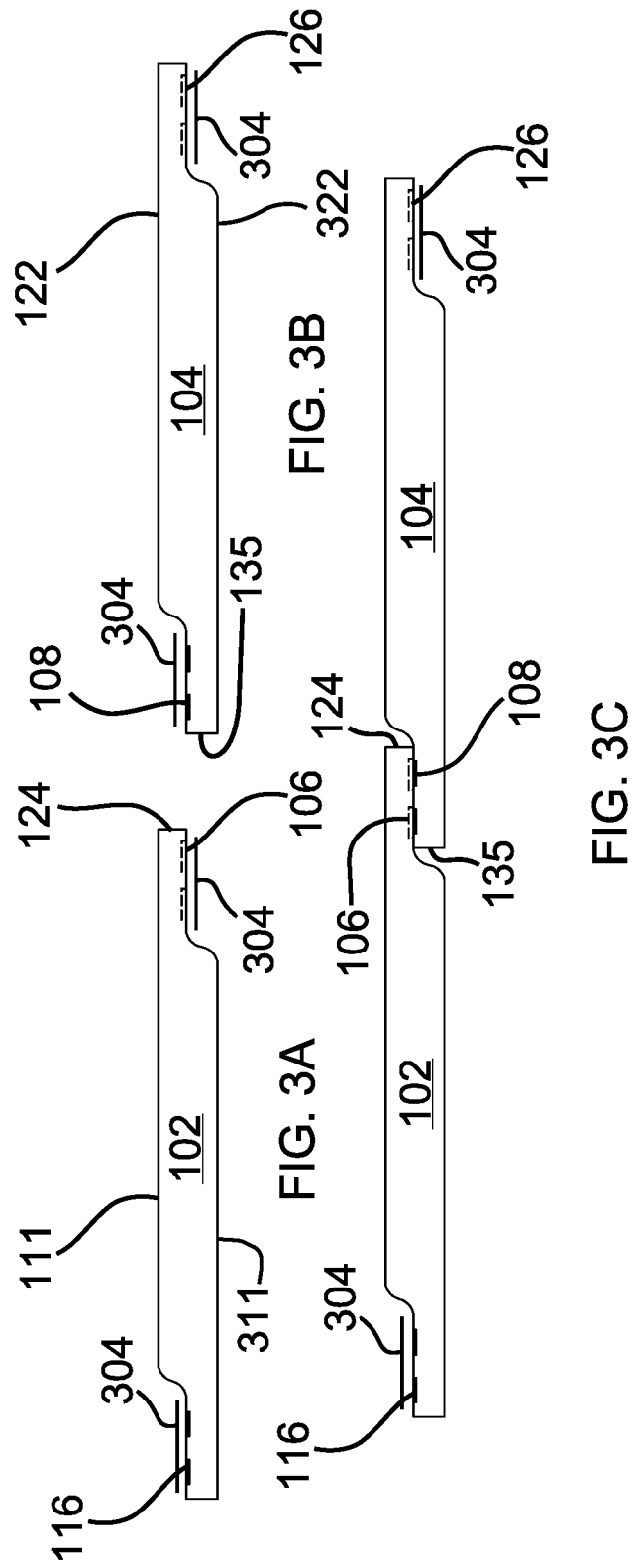
FIG. 3A is a cross section of the first PV module showing the contacts.
FIG. 3B is a cross section of the second PV module showing the contacts.
FIG. 3C is a cross section of the first and second PV modules connected together.

FIG. 3A is a cross section of a first PV module 102 showing the contacts 106 on a bottom surface 311 of the PV module 102 and contacts 116 on a top surface 111. The right hand side 124 is configured to overlap on top of the adjacent PV module 104. Protective backing material 304 remains in place until the PV modules are connected together.

FIG. 3B is a cross section of a second PV module 104 showing the contacts 108 on a top surface 122 of the PV module and contacts 126 on a bottom surface 322. The left hand side 135 is configured to fit below the adjacent PV module 104. Protective backing material 304 remains in place until the PV modules are connected together.

FIG. 3C is a cross section of two PV modules connected together. The protective backing material 304 has been removed from contacts 106 and 108. PV module 102 is electrically connected to PV module 104 via contacts 106 adhesively connected to contacts 108. The right hand side 124 of PV module 102 overlaps on top of the left hand side 124 of PV module 104. Contacts 116 and 126 are available for connection to additional PV modules in order to extend the electrical circuiting to more PV modules. If no additional PV modules are needed, the protective backing material 304 remains in place.

Figure 4:
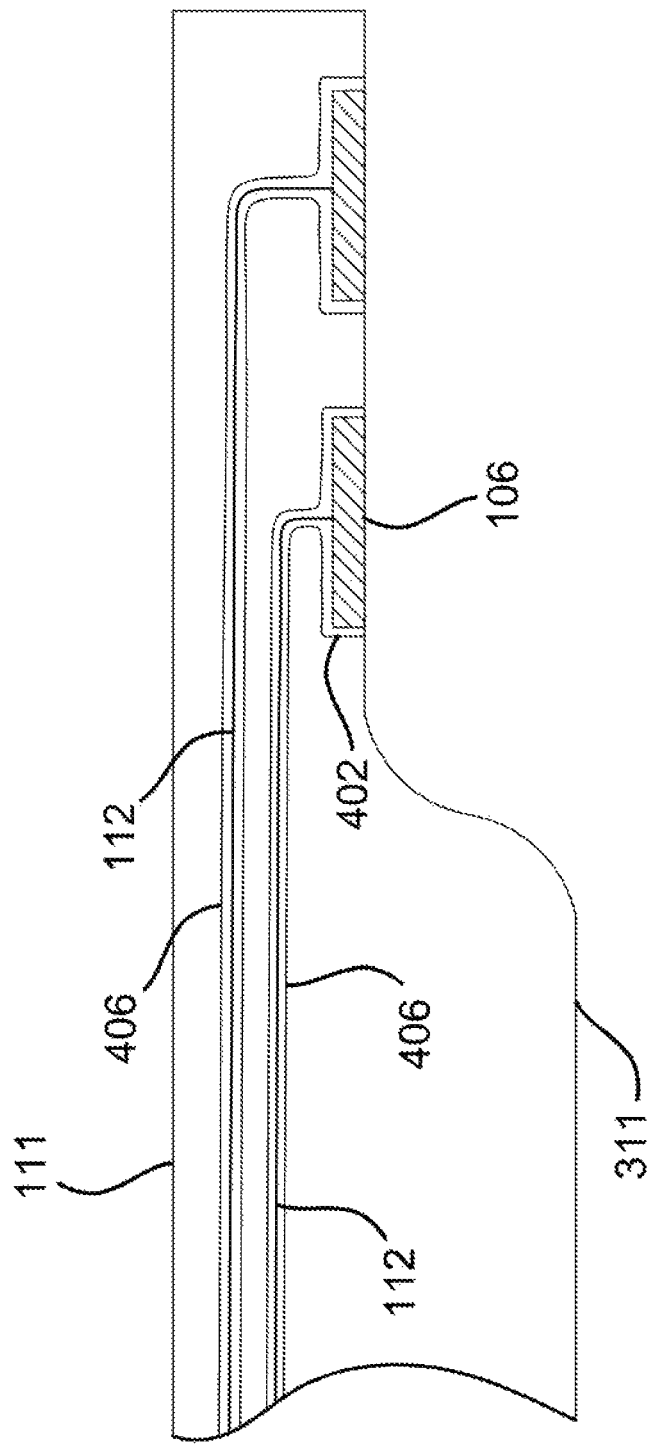
FIG. 4 is a section view of the PV module showing the electrical wiring and contacts.

FIG. 4 is a section view of the PV module showing the electrical wiring and contacts. PV module 102 is shown with the top surface 111 and bottom surface 311. Contacts 106 are embedded into the bottom surface 311 with only a bottom facing surface of the contacts 106 exposed. All other surfaces of contacts 106 are embedded into the module encapsulation. The contacts 106 are electrically isolated by insulating material 402. Electrical wiring 112 is isolated by insulating material 406.

Figure 5A:
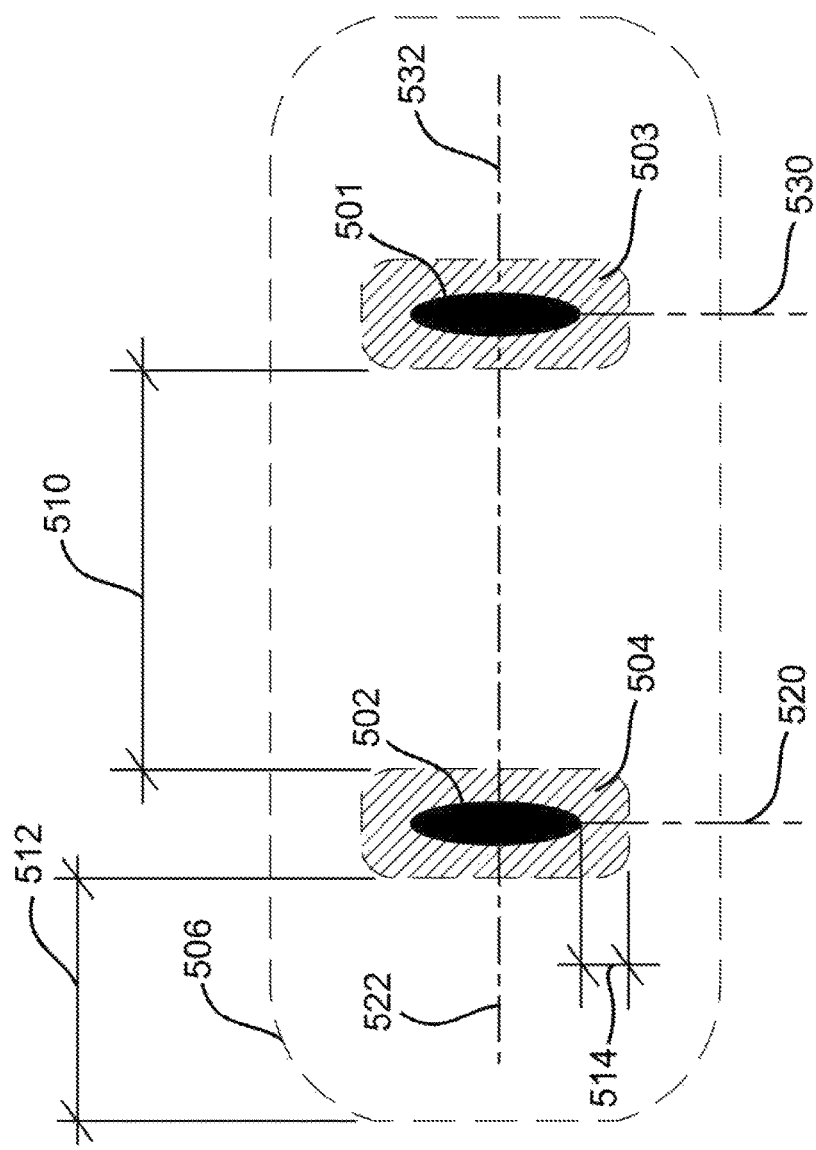
FIG. 5A is a top view of two contacts vertically oriented.

FIG. 5A is a top view of two contacts vertically oriented. Contacts 501 and 502 are oblong in order to allow for either misalignment when connecting to another PV Module, and also to allow for expansion and contraction due to changes in temperature and humidity. Electrically conductive adhesive 504 is coating contact 502 wherein the electrically conductive adhesive area 504 covers the entire top surface area of contact 502 and extends at least 0.5 cm beyond 514 each boundary edge of contact 502. Electrically conductive adhesive 503 is coating contact 501. This assures that there is good electrical conduction between the contacts when they are connected. The area of the electrically insulating adhesive 506 creating an air tight and moisture tight seal surrounding the one or more contacts is at least 2 cm. in width 512. This assures that there is enough surface area of encapsulation to provide the required protection. The surface area between contact 502 and contact 501 is at least 2.0 cm. in width 510. This spacing allows enough insulating non-conducting material between the contacts so that there will be no electrical short or continuity between adjacent contacts. Center line 522 and alignment line 530 align contact 501 with contact 541 in FIG. 5B. Center line 522 and alignment line 520 align contact 502 with contact 542 in FIG. 5B.

Figure 5B:
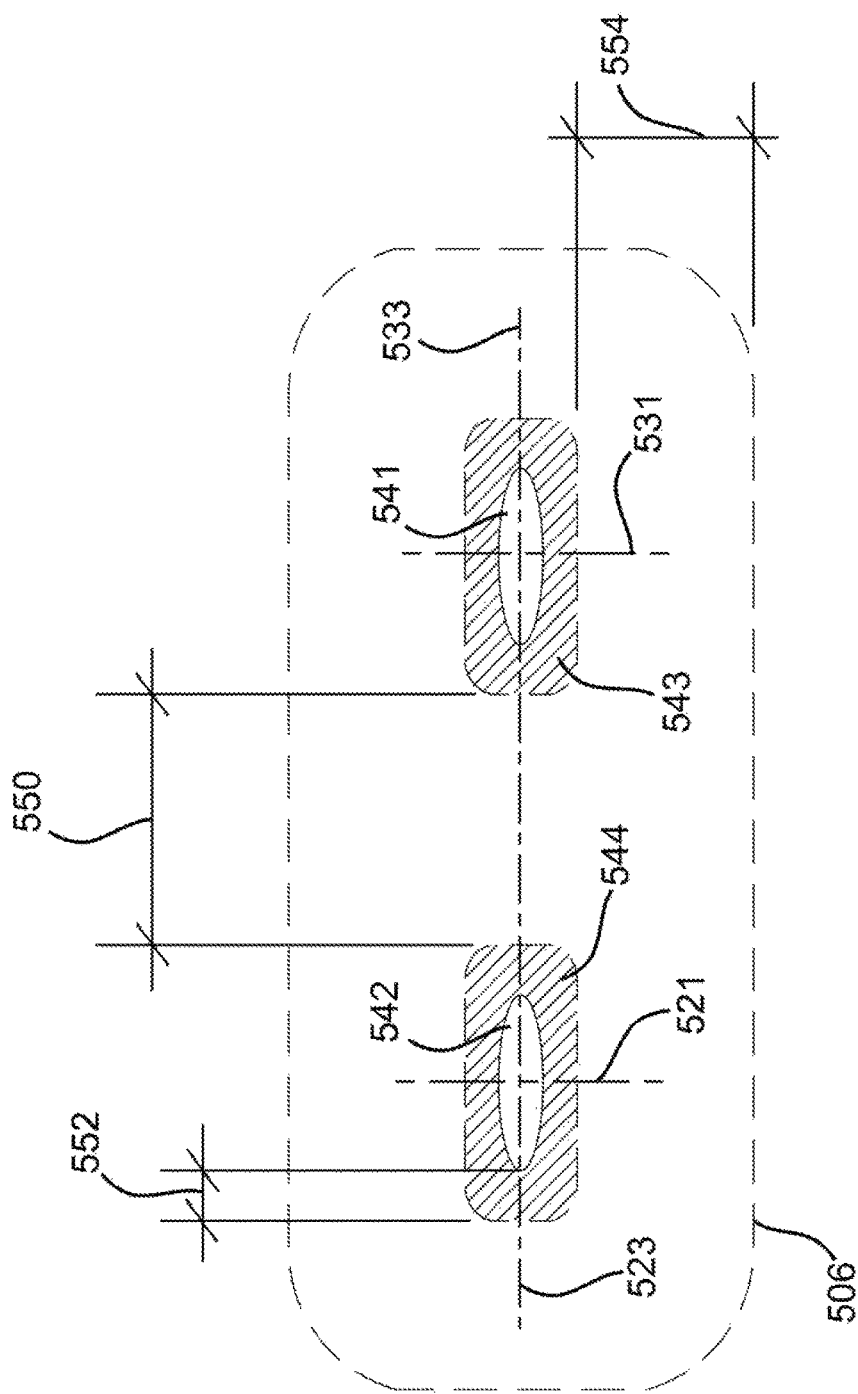
FIG. 5B is a top view of two contacts horizontally oriented.

FIG. 5B is a top view of two contacts horizontally oriented. Contacts 541 and 542 are oblong in order to allow for either misalignment when connecting to another PV Module, and also to allow for expansion and contraction due to changes in temperature and humidity. Electrically conductive adhesive 544 is coating contact 542 wherein the electrically conductive adhesive area 544 covers the entire top surface area of contact 542 and extends at least 0.5 cm beyond 552 each boundary edge of contact 542. Electrically conductive adhesive 543 is coating contact 541. This assures that there is good electrical conduction between the contacts when they are connected. The area of the electrically insulating adhesive 506 creating an air tight and moisture tight seal surrounding the one or more contacts is at least 2 cm. in width 554. This assures that there is enough surface area of encapsulation to provide the required protection. The surface area between contact 542 and contact 541 is at least 2.0 cm. in width 550. This spacing allows enough insulating non-conducting material between the contacts so that there will be no electrical short or continuity between adjacent contacts. Center line 523 and alignment line 521 align contact 542 with contact 502 in FIG. 5A. Center line 523 and alignment line 531 align contact 541 with contact 501 in FIG. 5A.

Figure 6B:
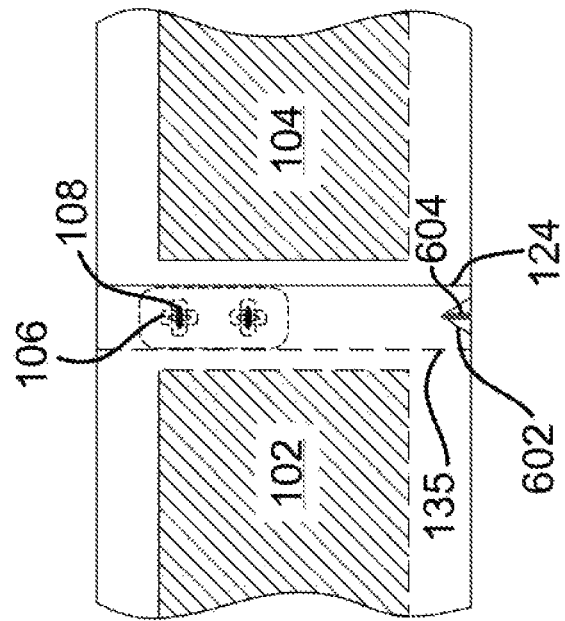
FIG. 6B shows two partial PV modules with the first and second PV modules connected with the guide line shown within the notch.
Figure 6A:
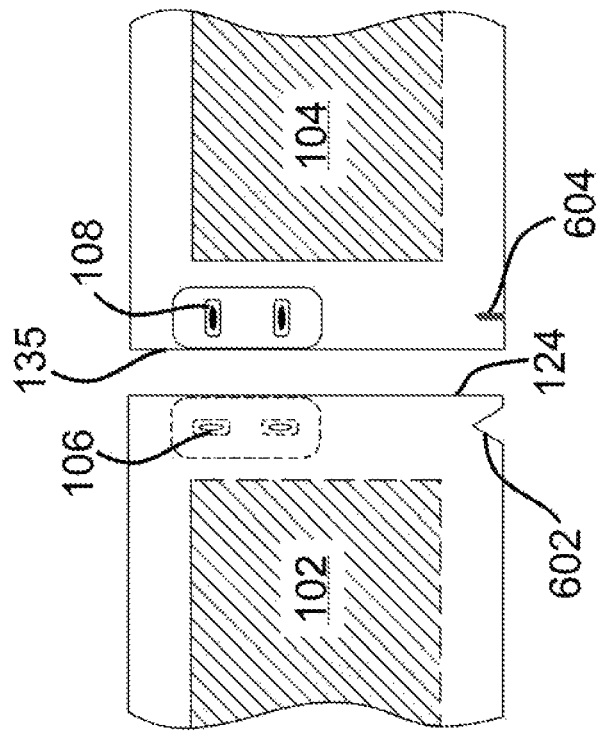
FIG. 6A shows two partial PV modules with a notch on the first PV module and a guide line on the second PV module.

FIG. 6A shows a partial view of two PV modules prior to connection. PV module 102 with a notch 602, and a guide line 604 on PV module 104. In order to align the two PV modules for connection, the guide line 604 is visually aligned within the notch 602 on PV module 102, aligning contacts 106 and 108. The right hand side of PV module 102 and the left hand side of PV module 104 are shown next to each other.

FIG. 6B shows two partial PV modules connected together. The right hand side 124 of PV module 102 is overlapping the left hand side 135 of PV module 104. The notch 602 of PV module 102 is aligned with the guide line 604 of PV module 104 aligning contacts 106 with contacts 108

Figure 7B:
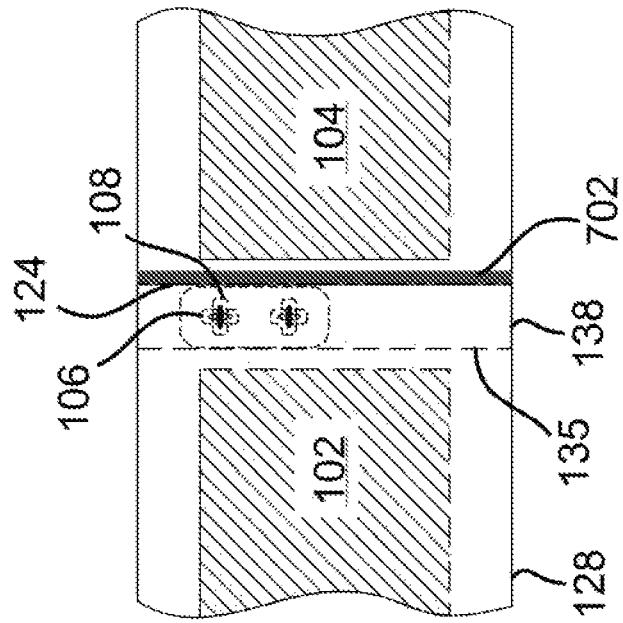
FIG. 7B shows two partial PV modules with the first PV module shown aligned to the guideline on the second PV module.
Figure 7A:
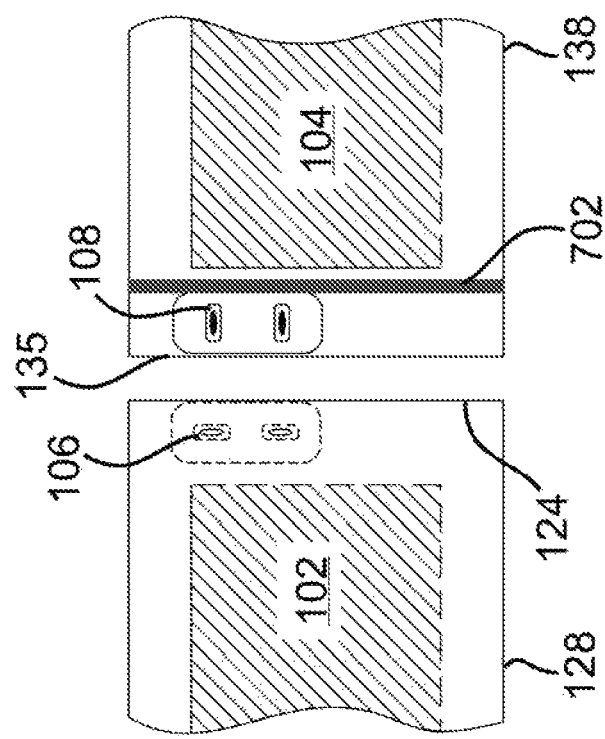
FIG. 7A shows two partial PV modules with the first PV module and a guide line on the second PV module.

FIG. 7A shows a partial view of two PV modules prior to connection. The right hand side 124 of PV module 102 aligns to a guide line 702 on PV module 104. In order to align the two PV modules for connection, the guide line 604 is visually aligned within the right hand side 124 on PV module 102, aligning contacts 106 and 108. The right hand side of PV module 102 and the left hand side of PV module 104 are shown next to each other. Edge 128 of PV module 102 is lined up with edge 138 of PV module 104.

FIG. 7B shows two partial PV modules connected together. The right hand side 124 of PV module 102 is overlapping the left hand side 135 of PV module 104. The right hand side 124 of PV module 102 is aligned with the guide line 702 of PV module 104 aligning contacts 106 with contacts 108. Edge 128 of PV module 102 is directly in line with edge 138 of PV module 104.

FIGS. 8A through 8I show a step by step process for connecting PV module 102 to PV module 104.

FIG. 8A is a side view of PV module 102 prior to connection. Protective backing material 304 is shown covering the electrically insulating adhesive 506. Protective backing material 304 is shown covering the adhesive 806 on the bottom surface 311 of PV module 102.

FIG. 8B is a side view of PV module 104 prior to connection.

FIG. 8C is a side view of PV module 102 prior to connection, with protective backing material 304 partially removed.

FIG. 8D is a side view of PV module 104 prior to connection, with protective backing material 304 partially removed.

FIG. 8E is a side view of PV module 102 with protective backing material completely removed, exposing the electrically insulating adhesive 506.

FIG. 8F is a side view of PV module 104 with protective backing material completely removed, the electrically insulating adhesive 506.

FIG. 8G is a side view of PV module 102 with protective backing material completely removed and arrows showing how it connects to PV module 104. The electrically insulating adhesive 506 adhesively connects PV module 102 to PV module 104.

FIG. 8H is a side view of PV module 104 with protective backing material completely removed and arrows showing how it connects to PV module 102. The electrically insulating adhesive 506 adhesively connects PV module 104 to PV module 102.

FIG. 8I is a side view of PV module 102 and PV module 104 connected together.

Figure 9:
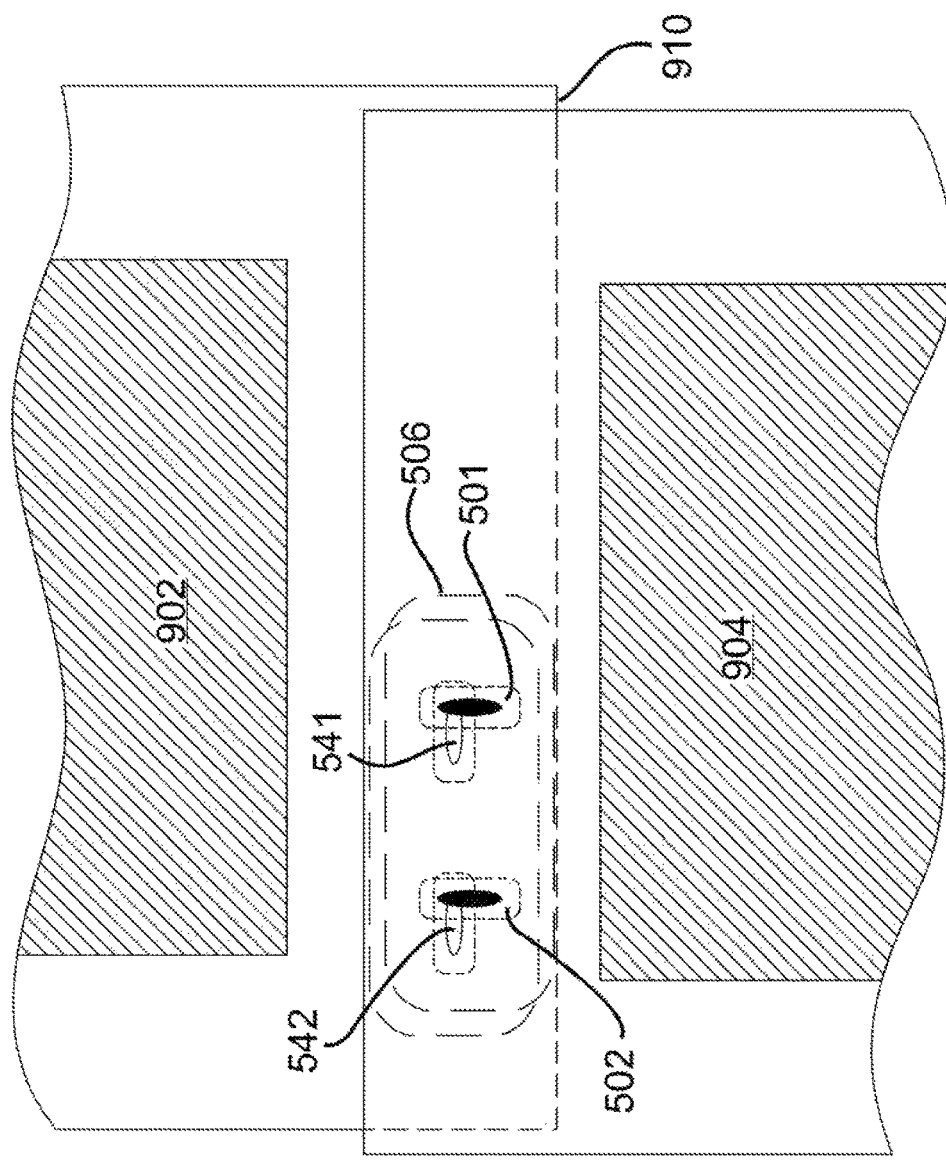
FIG. 9 is a top view showing how two PV modules connect together when they are slightly out of alignment.

FIG. 9 is a top view showing how two PV modules connect together when they are slightly out of alignment. PV module 904 is shown laying on top of PV module 902. The two PV modules were not completely aligned when they were adhesively connected together, so the misalignment 910 as shown has created a slight offset between contacts 501, 502, 541 and 542. Even though they are slightly offset, contact 502 is still partially connecting to contact 542. Likewise, contact 501 is connecting to contact 541. The area of the electrically insulating adhesive 506 creating an air tight and moisture tight seal surrounding the contacts is also still wide enough to provide the proper protective seal.

Figure 10:
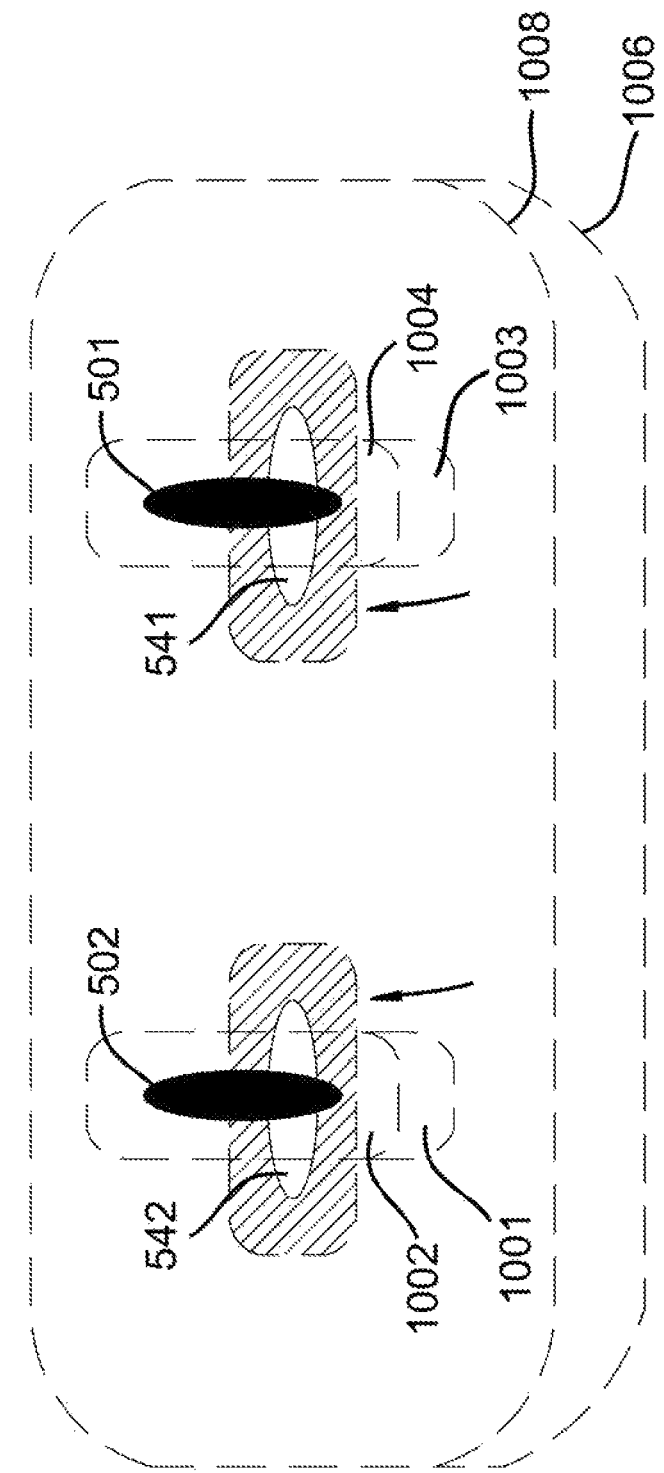
FIG. 10 is a top view of two sets of overlapping PV contacts demonstrating how expansion and contraction affects the connection.

FIG. 10 is a top view of two sets of overlapping PV contacts demonstrating how expansion and contraction affects the connection. The area of the electrically insulating adhesive 1006 is shown prior to the expansion from heat. The initial location of contact 502 and electrically conductive adhesive area 1001, along with the initial location of contact 501 and electrically conductive adhesive area 1003 are shown prior to the expansion. When heat is applied, the area 1006 shifts to a new location as shown as area 1008. Likewise, contact 502 shifts from 1001 to 1002. Contact 501 shifts from 1003 to 1004. This shifting due to expansion and contraction is facilitated by the expansion and contraction properties of the adhesive. The mating design of the contacts enables the electrical connection to remain functional during and after the shift.

Figure 11A:
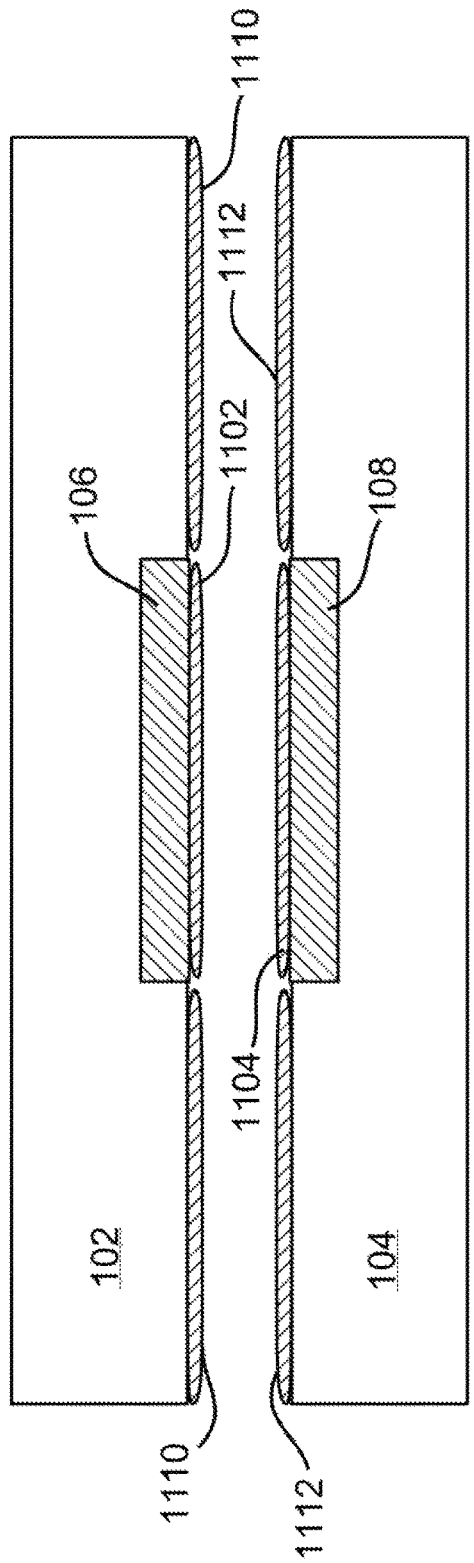
FIG. 11A is a side view of two PV modules' contacts prior to connection.

FIG. 11A is a side view of two PV modules' contacts prior to connection. Contact 106 of PV module 102 is aligned with contact 108 of PV module 104 as shown. Electrically insulating adhesive 1110 is shown on the connecting surface surrounding contact 106. Electrically conductive metal 1102 is shown on the surface of contact 106. Electrically insulating adhesive 1112 is shown on the connecting surface surrounding contact 108. Electrically conductive metal 1104 is shown on the surface of contact 108.

Figure 11B:
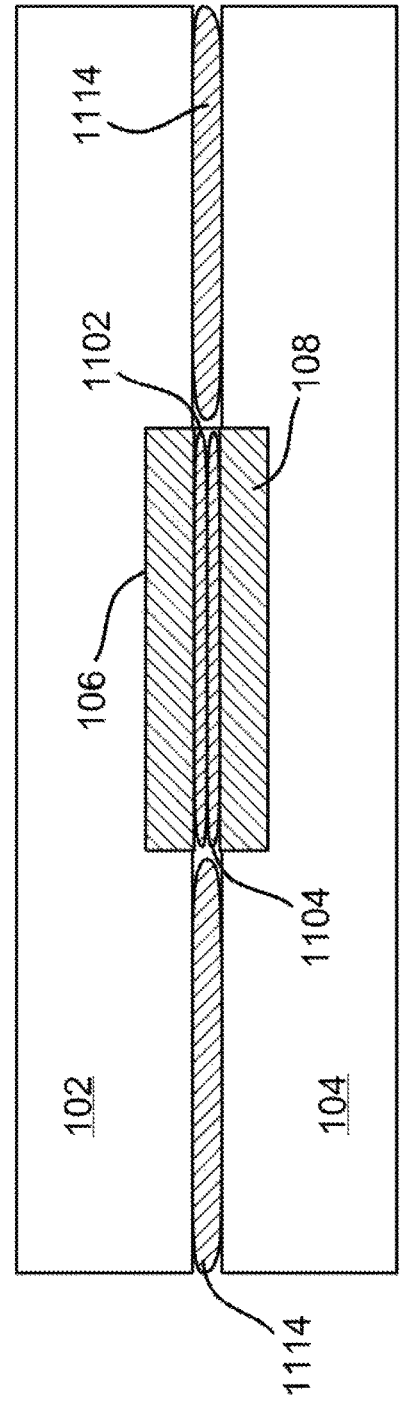
FIG. 11B is a side view of two PV modules' contacts that are connected.

FIG. 11B is a side view of PV module 102 connected to PV module 104. The electrically insulating adhesive 1114 has bounded together from the two PV modules providing an air tight and moisture tight seal surrounding the contacts. The electrically conductive metal 1102 of PV module 102 and the electrically conductive metal 1104 of PV module 104 are in direct contact with each other via electrically conductive metal 1104 which provides continuity and a current path for the electrical current to flow between them.

Figure 11C:
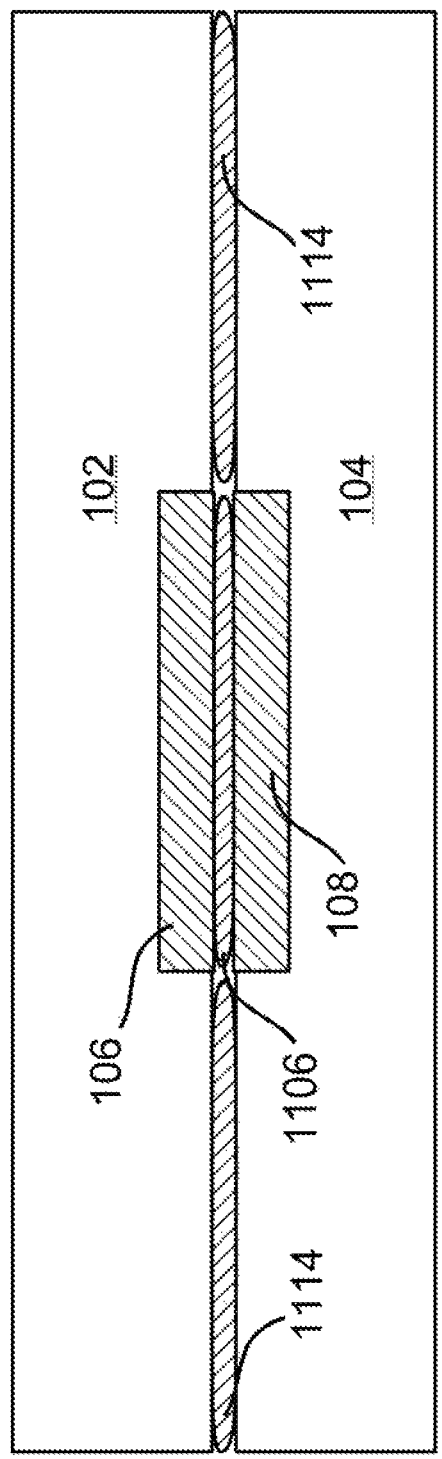
FIG. 11C is a side view of two PV modules' contacts that are connected after heat has been applied.

FIG. 11C is a side view of PV module 102 connected to PV module 104 after heat has been applied. This view shows the electrically conductive metal 1106 from contact 106 to contact 108 bonded completely together from the application of heat. The electrically conductive metal 1106 provides both an electrical connection between the contacts and also mechanically bonds the contacts together.

FIG. 12A is a side view of PV module 102 with a foam backing 1202 between contact 106 and PV module 102 as shown. The foam backing is embedded as shown, and provides load deflection forcing contact 106 outward from PV module 102 towards the contact of the PV module it will be connected to. Electrically insulating adhesive 1110 is shown on the connecting surface surrounding contact 106.

FIG. 12B is a side view of PV module 102 connected to PV module 106. The foam backing 1202 is embedded as shown, and provides load deflection forcing contact 106 outward from PV module 102 towards contact 108 in PV module 104. Contact 106 and 108 are held tight to each other from the deflection forces of foam 1202 and 1204. Electrically insulating adhesive 1114 is shown which connects PV module 102 to PV module 104, maintaining the connective force required to sustain the connection between contact 106 and 108.

Figure 13:
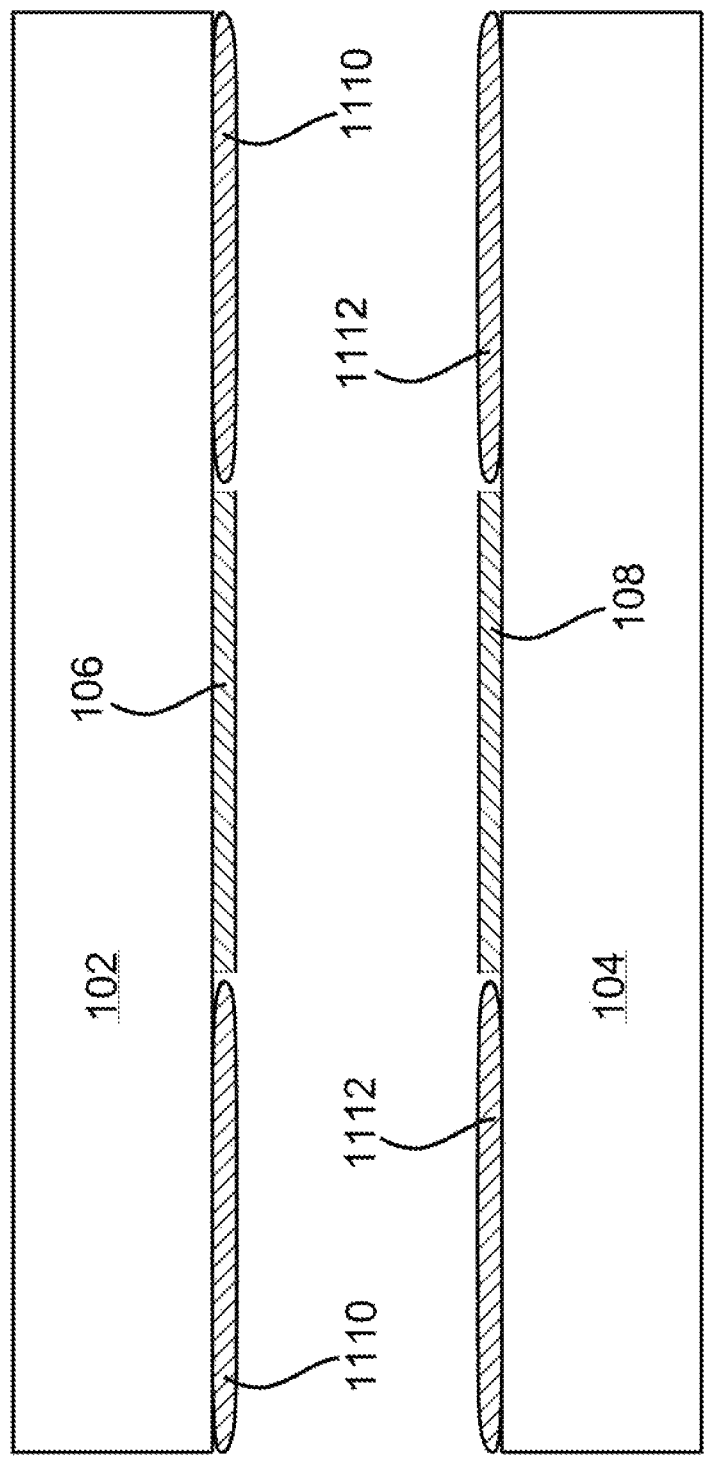
FIG. 13 is a side view of two PV modules' surface mounted contacts prior to connection.

FIG. 13 is a side view of PV module 102 and PV module 104. Contacts 106 and 108 are shown as surface mounted contacts that are embedded onto the surface of the PV module. Adhesive 1110 and adhesive 1112 connect together providing the mechanical connection required to hold contact 106 to contact 108. This view illustrates how the contacts 106 and 108 are embedded into a surface have only one surface of the contact embedded into the exterior surface of the PV module.

Figure 14:
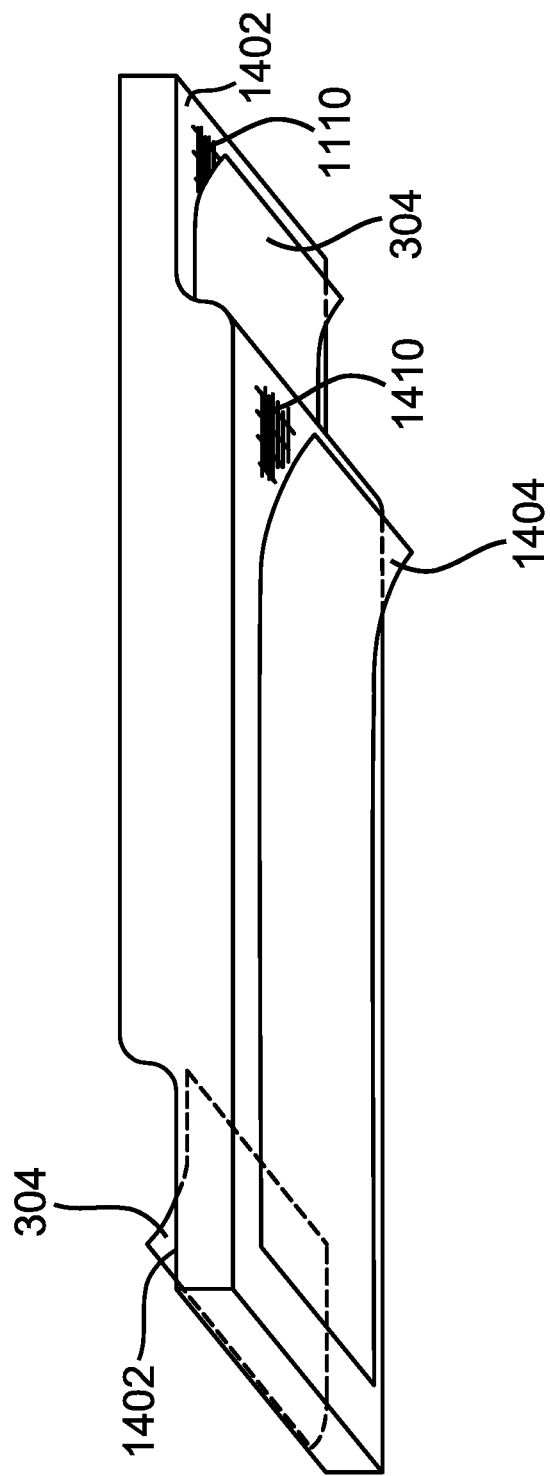
FIG. 14 is an isometric view of the PV module showing the protective backing material partially removed.

FIG. 14 is an isometric view of PV module 102 showing the protective backing material 304 partially removed. Electrically insulating adhesive 1110 is shown behind the protective backing material 304. Each section can be removed as required to first make the electrical connections by removing the protective backing covering the contacts and making that connection first. Once the adhesive contact areas 1402 have been connected, the remaining protective backing material 1404 can be removed exposing adhesive area 1410 for attachment of the PV module to a surface.

The invention claimed is:

1. A photovoltaic (PV) modular connector system comprising:
    two or more photovoltaic (PV) modular connectors, each modular connector comprising:
    electrical wiring connected to a first photovoltaic (PV) module;
        two or more contacts connected to the electrical wiring, wherein the two or more contacts comprise an electrically conductive material, embedded into a surface of the first PV module;
        the surface of the first PV module further comprising an area comprising electrically insulating adhesive separating the two or more contacts from each other;
        wherein the first PV module is adhesively attached and electrically connected to a second PV module;
        wherein at least two parallel contacts of the two or more contacts are flat and parallel to the surface and parallel to a long side of a bottom surface of the first PV module;
        wherein the second PV module further comprises a set of perpendicular contacts that are flat and parallel to the surface and perpendicular to a long side of a top surface of the second PV module; and
        wherein the parallel contacts of the first PV module are configured to allow a misaligned mating with the perpendicular contacts of the second PV module when the first PV module is placed on top of the second PV module.

2. The PV modular connector system of claim 1, wherein the electrical wiring connected to the two or more contacts is completely encapsulated and electrically insulated; and wherein all but one surface of the two or more contacts are encapsulated, allowing only one surface of each of the two or more contacts to be exposed on an exterior surface of the first PV module.

3. The PV modular connector system of claim 1, wherein the two or more contacts and the set of contacts are comprised of one or more of electrically conductive materials comprising alloys of copper, aluminum, nickel, stainless steel, silver, graphite, tungsten, and carbide.

4. The PV modular connector system of claim 1, wherein the two or more contacts and the set of contacts are coated with an electrically conductive adhesive.

5. The PV modular connector system of claim 4, wherein the electrically conductive adhesive comprises one or more electrically conductive materials of carbon, graphite, tungsten, graphene, carbon nanotubes and carbide.

6. The PV modular connector system of claim 4, wherein the electrically conductive adhesive area covers an entire area of one or more contacts and extends at least 0.5 cm beyond each boundary edge of a surface of the one or more contacts.

7. The PV modular connector system of claim 1, wherein the two or more contacts in the first PV module are embedded with a foam backing providing load deflection forcing the two or more contacts outward from the first PV module towards the set of contacts in the second PV module.

8. The PV modular connector system of claim 1, wherein the two or more contacts and the set of contacts are coated with an electrically conductive metal with a melting point in the range of between 28 and 45 degrees Celsius from one or more alloys comprising: gallium, rubidium and phosphorus.

9. The PV modular connector system of claim 1, wherein the electrically insulating adhesive allows for expansion and contraction.

10. The PV modular connector system of claim 1, wherein the electrically insulating adhesive of the first PV module are adhesively connected to the second PV module creating an air tight and moisture tight seal encapsulating the two or more contacts and the set of contacts.

11. The PV modular connector system of claim 10, wherein a surface area of the electrically insulating adhesive creating an air tight and moisture tight seal surrounding the two or more contacts is at least 2 cm. in width.

12. The PV modular connector system of claim 1, wherein the two or more contacts are rated for a total combined electrical current flow of the first PV module, the second PV module, and additional one or more connected PV modules.

13. The PV modular connector system of claim 1, wherein a surface area between two adjacent contacts of the two or more contacts on the first module is at least 2.0 cm. in width.

14. The PV modular connector system of claim 1, wherein the first PV module has a notch for viewing an alignment line printed on the surface of the second PV module.

15. The PV modular connector system of claim 1, wherein the first PV module has an alignment line printed on the surface for visual alignment of the second PV module.

16. The PV modular connector system of claim 1, wherein the electrically insulating adhesive area is covered by a protective backing material; wherein the protective backing material is removed at the time of installation, exposing the adhesive.

17. The PV modular connector system of claim 1, wherein each area of an attachment surface of the first PV module is covered with module adhesive and a module protective backing material, allowing the module protective backing material to be removed and exposing the module adhesive.

* * * * *